(12) United States Patent
Oku et al.

(10) Patent No.: US 10,563,307 B2
(45) Date of Patent: Feb. 18, 2020

(54) METHOD FOR MANUFACTURING SUBSTRATE

(71) Applicant: AIR WATER INC., Sapporo-shi, Hokkaido (JP)

(72) Inventors: Hidehiko Oku, Nagano (JP); Ichiro Hide, Nagano (JP)

(73) Assignee: AIR WATER INC. (JP)

(*) Notice: Subject to any disclaimer, the term of this patent is extended or adjusted under 35 U.S.C. 154(b) by 0 days.

(21) Appl. No.: 16/308,080

(22) PCT Filed: Jun. 9, 2017

(86) PCT No.: PCT/JP2017/021545
§ 371 (c)(1),
(2) Date: Dec. 7, 2018

(87) PCT Pub. No.: WO2017/213264
PCT Pub. Date: Dec. 14, 2017

(65) Prior Publication Data
US 2019/0177852 A1      Jun. 13, 2019

(30) Foreign Application Priority Data

Jun. 10, 2016   (JP) ................... 2016-116071

(51) Int. Cl.
*C23C 16/56* (2006.01)
*C30B 25/18* (2006.01)
(Continued)

(52) U.S. Cl.
CPC ............ *C23C 16/56* (2013.01); *C23C 16/325* (2013.01); *C23F 1/02* (2013.01); *C30B 25/18* (2013.01); *C30B 29/36* (2013.01)

(58) Field of Classification Search
None
See application file for complete search history.

(56) References Cited

U.S. PATENT DOCUMENTS 4,941,942 A  *  7/1990  Bruns ................. G03F 1/22
                                                      216/2
4,994,141 A  *  2/1991  Harms ................ G03F 1/22
                                                      216/2
(Continued)

FOREIGN PATENT DOCUMENTS

JP      06-216050 A    8/1994
JP      07-118854 A    5/1995
(Continued)

OTHER PUBLICATIONS

International Preliminary Report on Patentability and Written Opinion, dated Dec. 11, 2018 in International Application No. PCT/JP2017/021545.

(Continued)

*Primary Examiner* — Allan W. Olsen
(74) *Attorney, Agent, or Firm* — Wood, Phillips, Katz, Clark & Mortimer

(57) ABSTRACT

A method for manufacturing a substrate with less warpage includes a step of forming SiC film 121 on a surface of Si substrate 11, a step of removing bottom surface RG2 which is at least a part of the Si substrate 11 contacting with the SiC film 121, and a step of forming another SiC film on a surface of SiC film 121 after the step of removing the bottom surface RG2.

11 Claims, 24 Drawing Sheets

(51) Int. Cl.
*C30B 29/36* (2006.01)
*C23C 16/32* (2006.01)
*C23F 1/02* (2006.01)

(56) References Cited

U.S. PATENT DOCUMENTS

| | | | | |
|---|---|---|---|---|
| 5,471,946 | A * | 12/1995 | Scholz | C30B 25/02 117/84 |
| 6,812,473 | B1 * | 11/2004 | Amemiya | G03F 1/20 250/492.1 |
| 2001/0014536 | A1 | 8/2001 | Nakamura et al. | |
| 2002/0029638 | A1 * | 3/2002 | Kurtz | G01L 1/2293 73/715 |
| 2016/0247967 | A1 * | 8/2016 | Ward | H01L 33/12 |

FOREIGN PATENT DOCUMENTS

| | | |
|---|---|---|
| JP | 09-310170 A | 12/1997 |
| JP | H09-310170 A | 12/1997 |
| JP | 11-329960 A | 11/1999 |
| JP | 2002-025916 A | 1/2002 |
| JP | 2012-119655 A | 5/2011 |
| JP | 2015-202990 A | 11/2015 |

OTHER PUBLICATIONS

International Search Report dated Sep. 12, 2017 in International Patent Application No. PCT/JP2017/021545.
Supplementary European Search Report, dated Nov. 21, 2019, in European Patent Application No. EP 17 81 0436.

\* cited by examiner

METHOD FOR MANUFACTURING SUBSTRATE

TECHNOLOGICAL FIELD

The present invention relates to a method for manufacturing substrates. More specifically, it relates to a method for manufacturing substrates with less warpage.

DESCRIPTION OF THE RELATED ART

SiC has better thermal resistance and withstand voltage properties than Si (silicon), and the power loss when used as electronic devices is small. For this reason, SiC is being used as a next-generation semiconductor material, for example, for high-performance and power-saving inverter equipment, power modules for domestic electric appliances, power semiconductor devices for electric vehicles, and so on.

In addition, SiC has a higher Young's modulus, a high yield strength at high temperature, and high chemical stability, than Si. For this reason, it is studied to use SiC as MEMS (Micro Electro Mechanical Systems). Further, since SiC has a high light transmittance, other applications utilizing these properties are being studied.

SiC free-standing substrates are usually formed by forming a SiC film on a Si substrate and then etching a part or all of the Si substrate. When a part of the Si substrate was etched, a partial free-standing substrate with a part of the SiC film supported by the Si substrate is obtained. When all of the Si substrate was etched, a complete free-standing substrate of the SiC film is obtained.

When a Si substrate is etched, the Si substrate on which a SiC film was formed is immersed in liquid chemical. Techniques for forming SiC films are disclosed, for example, in Patent Documents 1 to 3 below.

The following technique is disclosed in the following Patent Document 1. A SiC film with a thickness of about 1 micrometer is formed on surfaces of a Si substrate. A substrate opening is formed by removing one of surfaces of the SiC film with an arbitrary area. The Si substrate is etched through the substrate opening with the SiC film as a mask. When the Si substrate is etched, a mixture of hydrofluoric acid and nitric acid is used.

The following Patent Document 2 discloses a technique for manufacturing X-ray mask including a SiC film. In this technique, a SiC film with 2 micrometer thick is formed on a Si wafer. A protective film and an X-ray absorbing film are formed on the SiC film. An etching resistant material is applied to the lower surface of the Si wafer, in the form of a ring. The central part of the Si wafer is removed by using aqueous solution of sodium hydroxide.

The following patent document 3 discloses the following technique. A 3C-SiC layer is formed on one side of a Si substrate including a reinforcing member. The Si substrate is dissolved with an etching solution mixed with hydrofluoric acid, nitric acid, and the like.

PRIOR ART DOCUMENTS

Document(s) Related to Patents

[Patent Document 1] Japanese Patent Laid-Open No. (HEI) 09-310170
[Patent Document 2] Japanese Patent Laid-Open No. (HEI) 07-118854
[Patent Document 3] Japanese Patent Laid-Open No. 2015-202990

SUMMARY OF THE INVENTION

Problems to Be Resolved by the Invention

In order to ensure the mechanical strength of a SiC free-standing substrate (including a partially free-standing substrate), it is preferable that the SiC film in the SiC free-standing substrate is formed with a certain thickness (for example, a thickness of 20 micrometer or more and 500 micrometer or less). However, when a thick SiC film is formed on a Si substrate at the time of manufacturing a SiC free-standing substrate, there is a problem that warpage is generated in the SiC film due to the difference between physical properties (a lattice constant and a thermal expansion coefficient) between Si and SiC.

Regarding this problem, as in the techniques of the above Patent Documents 1 to 3, a method of removing a part or all of the Si substrate after formation of a SiC film is conceivable. However, even when this method is used, warpage of the SiC film remained after removing the Si substrate, since the SiC film is thick. This problem is more conspicuous as the SiC film is thicker and the substrate size is larger. This problem was an obstacle to obtaining a large-area SiC free-standing substrate with less warpage.

The present invention is intended to solve the above problems. The purpose is to provide a method for manufacturing a substrate with fewer warpage.

SUMMARY OF THE INVENTION

According to one aspect of the invention, a method for manufacturing a substrate comprises steps of: forming a SiC film on one of principal surfaces of a Si substrate, removing at least a part of the Si substrate in contact with the SiC film, and forming another SiC film on one of principal surfaces of the SiC film, after the step of removing at least a part of the Si substrate.

Preferably, in the manufacturing method, at least a part of another of the principal surfaces of the Si substrate is removed by wet etching, in the step of removing at least a part of the Si substrate, and the Si substrate and the SiC film are relatively moved with respect to liquid chemical used for the wet etching.

Preferably, in the manufacturing method, the Si substrate and the SiC film are moved in a direction in a plane parallel to the one of the principal surfaces of the SiC film, in the step of removing at least a part of the Si substrate.

Preferably, in the manufacturing method, liquid chemical used for the wet etching is injected onto the another of the principal surfaces of the Si substrate, in a state where the Si substrate and the SiC film are rotated, in the step of removing at least a part of the Si substrate.

Preferably, the manufacturing method further comprises the step of forming a recessed part having Si as a bottom surface at a central part of the another of the principal surfaces of the Si substrate, wherein the SiC film is exposed on the bottom surface of the recessed part in the step of removing at least a part of the Si substrate.

Preferably, in the manufacturing method, the step of forming the SiC film on the one of the principal surfaces of the Si substrate is performed, after the step of forming the recessed part at the central part of the another of the principal surfaces of the Si substrate.

Preferably, in the manufacturing method, the step of forming the recessed part at the central part of the another of the principal surfaces of the Si substrate is performed, after the step of forming the SiC film on the one of the principal surfaces of the Si substrate.

Preferably, in the manufacturing method, the central part of the another of the principal surfaces of the Si substrate is removed by wet etching, with a mask layer made of a oxide film or a nitride film formed on the another of the principal surfaces of the Si substrate as a mask, in the step of forming the recessed part at the central part of the another of the principal surfaces of the Si substrate.

Preferably, in the manufacturing method, the SiC film is formed on the one of the principal surfaces and a side surface of the Si substrate and on the peripheral part of the another of the principal surfaces of the Si substrate, in the step of forming the SiC film, and the another of principal surfaces of the Si substrate is removed, with the SiC film formed on the peripheral part of the another of the principal surfaces of the Si substrate as a mask, in the step of removing at least a part of the Si substrate.

Preferably, in the manufacturing method, mixed acid including hydrofluoric acid and nitric acid is used as liquid chemical used for the wet etching, in the step of removing at least a part of the Si substrate.

Preferably, the manufacturing method further comprises a step of removing the Si substrate completely, after the step of forming the another SiC film.

Effect of the Invention

According to the present invention, it is possible to provide a method for manufacturing a substrate with less warpage.

DETAILED DESCRIPTION OF EMBODIMENTS

Hereinafter, embodiments of the present invention will be described with reference to the drawings.

First Embodiment

Figure 1:
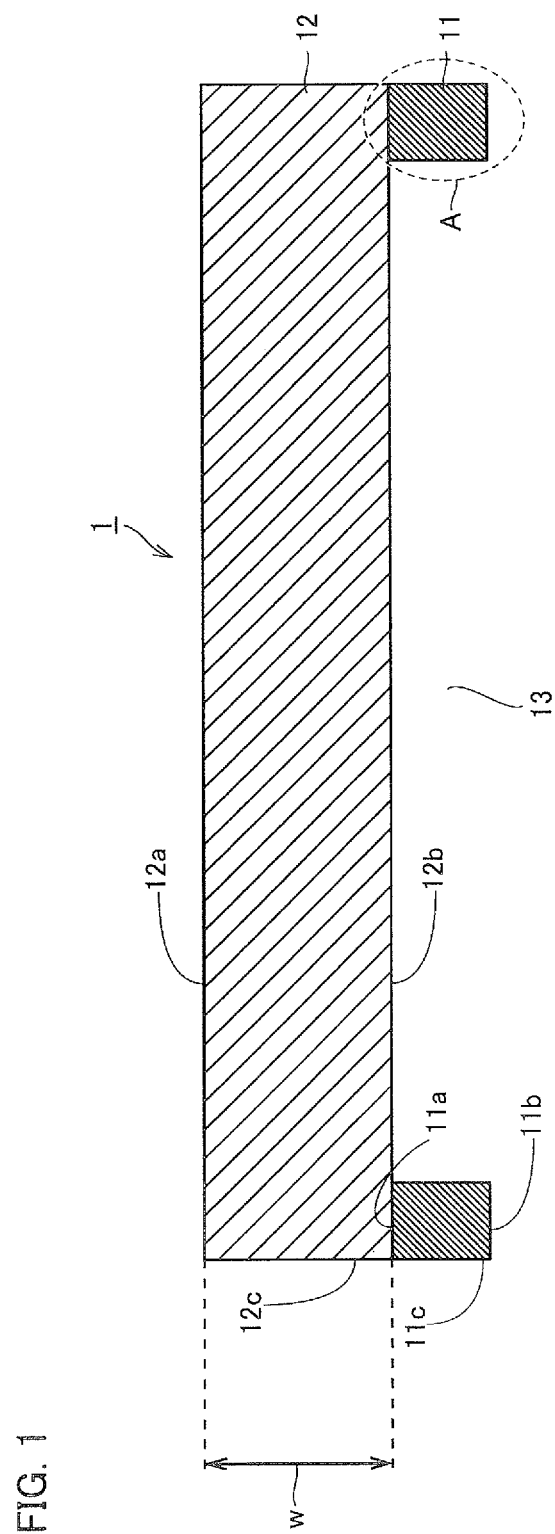
FIG. 1 is a cross-sectional view showing a configuration of substrate 1 according to the first embodiment of the present invention.

FIG. 1 is a cross-sectional view showing the configuration of the substrate 1 in the first embodiment of the present invention. Note that FIG. 1 is a cross-sectional view obtained by cutting with a plane perpendicular to the surface 12a of the SiC film 12.

Referring to FIG. 1, the substrate 1 in the present embodiment is a SiC free-standing substrate partially supported by Si substrate 11, and is equipped with Si substrate 11 and SiC film 12.

Si substrate 11 has a ring-like planar shape. Si substrate 11 includes surface 11a, reverse side 11b, and side surface 11c. The (111) plane is exposed on surface 11a of Si substrate 11. The (100) plane or the (110) plane may be exposed on the surface 11a of the Si substrate 11.

SiC film 12 is formed on the surface 11a of Si substrate 11 (an example of the one of the principal surfaces of the Si substrate). The SiC film 12 includes surface 12a, reverse side 12b, and side surface 12c. The reverse side 12b of the SiC film 12 is exposed to the recessed part 13 inside the ring-like Si substrate 11. The SiC film 12 is not formed on the reverse side 11b of Si substrate 11 (an example of the other of the principal surfaces of the Si substrate). The reverse side 11b of Si substrate 11 is exposed.

The SiC film 12 has a thickness w of 20 micrometer or more and 500 micrometer or less. The SiC film 12 is made of single-crystal 3C-SiC, poly-crystal 3C-SiC, amorphous SiC, or the like. In particular, if SiC film 12 was epitaxially growth on the surface of Si substrate 11, the SiC film 12 is generally made of 3C-SiC.

Figure 2:
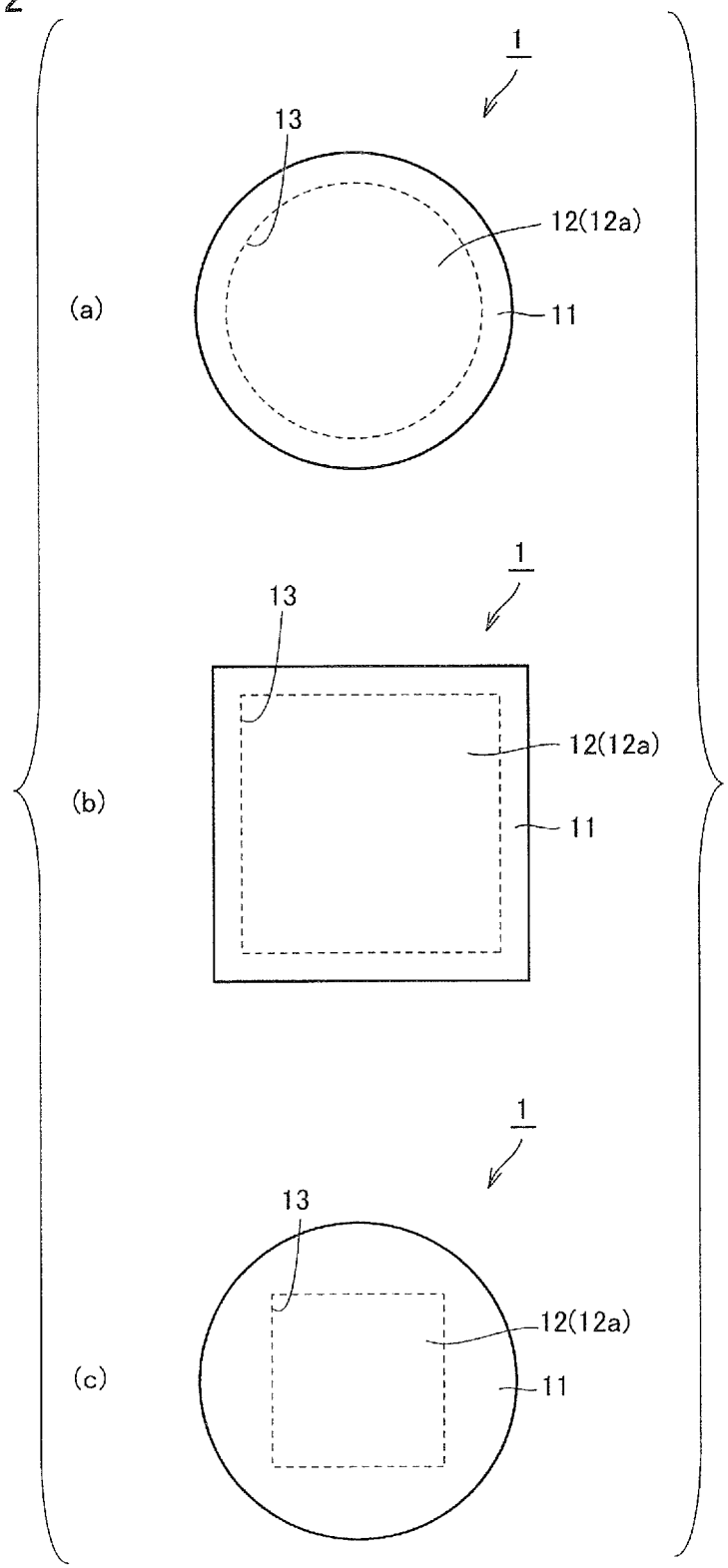
FIG. 2 is a plan view showing the configuration of substrate 1 when viewed from the direction perpendicular to the surface 12a of the SiC film 12, in the first embodiment of the present invention.

FIG. 2 shows a plan view showing the configuration of substrate 1 when viewed from the direction perpendicular to the surface 12a of the SiC film 12, in the first embodiment of the present invention. In FIG. 2, for the purpose of showing the shape of the Si substrate 11, the Si substrate 11 is indicated by a dotted line. Actually, Si substrate 11 is not observed directly.

Referring to FIG. 2, each of Si substrate 11, SiC film 12, and recessed part 13 has an arbitrary planar shape. The outer peripheral end portion of the SiC film 12 is supported by the ring-like Si substrate 11. As a result, the mechanical strength of SiC film 12 is reinforced by Si substrate 11. For example, as shown in FIG. 2 (a), each of Si substrate 11, SiC film 12, and recessed part 13 may have a circle planar shape. As shown in FIG. 2 (b), each of Si substrate 11, SiC film 12, and recessed part 13 may have a rectangular planar shape. In FIG. 2 (b), Si substrate 11 has a square ring-like planar shape. Furthermore, as shown in FIG. 2 (c), each of Si substrate 11 and SiC film 12 may have a circular planar shape. The recessed part 13 may have a rectangular planar shape. The size of the recessed part 13 is arbitrary. The size of the recessed part 13 may be determined according to the mechanical strength required for the substrate 1 or the like.

Next, the method for manufacturing of the substrate 1 in the present embodiment will be described with reference to FIG. 3 to FIG. 17.

Figure 3:
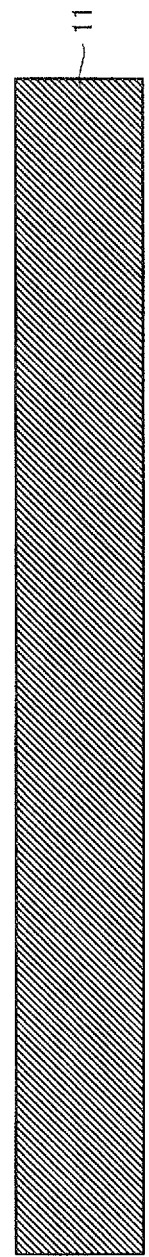
FIG. 3 is a cross-sectional view showing the first step of the method for manufacturing of the substrate 1, in the first embodiment of the present invention.

Referring to FIG. 3, for example, disc-shaped Si substrate 11 (on which recessed part 13 is not formed) is prepared.

Figure 4:
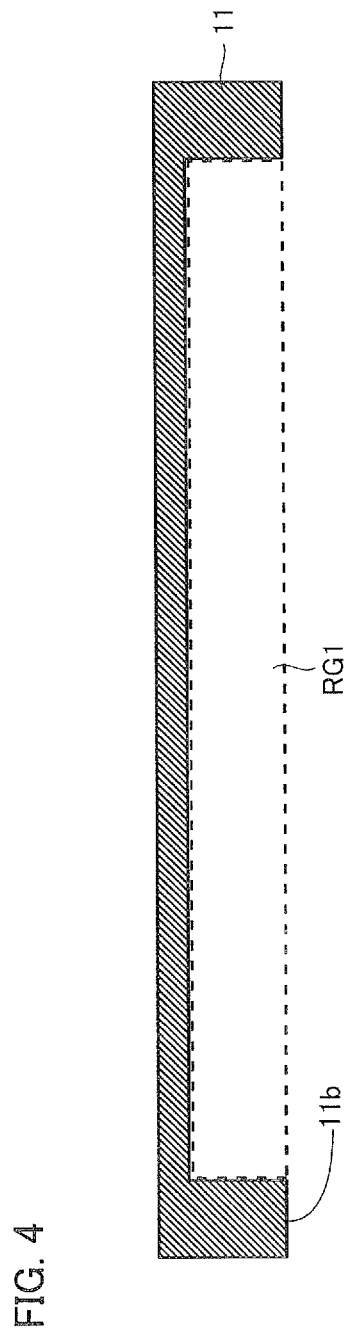
FIG. 4 is a cross-sectional view showing the second step of the method for manufacturing of the substrate 1, in the first embodiment of the present invention.

Next, referring to FIG. 4, Si of central part RG 1 of reverse side 11b of Si substrate 11 is removed. The removal of Si of central part RG1 may be carried out by mechanically grinding Si of central part RG1 of Si substrate 11. Also, the removal of Si of central part RG 1 may be performed as follows. Photoresist is formed on the reverse side 11b of Si substrate 11 except for central part RG1. The Si of central part RG1 is etched using the photoresist formed as a mask.

In order to increase the resistance of the mask to liquid chemical used for wet etching of Si, the removal of Si of central part RG1 may be carried out by the following method.

Figure 5:
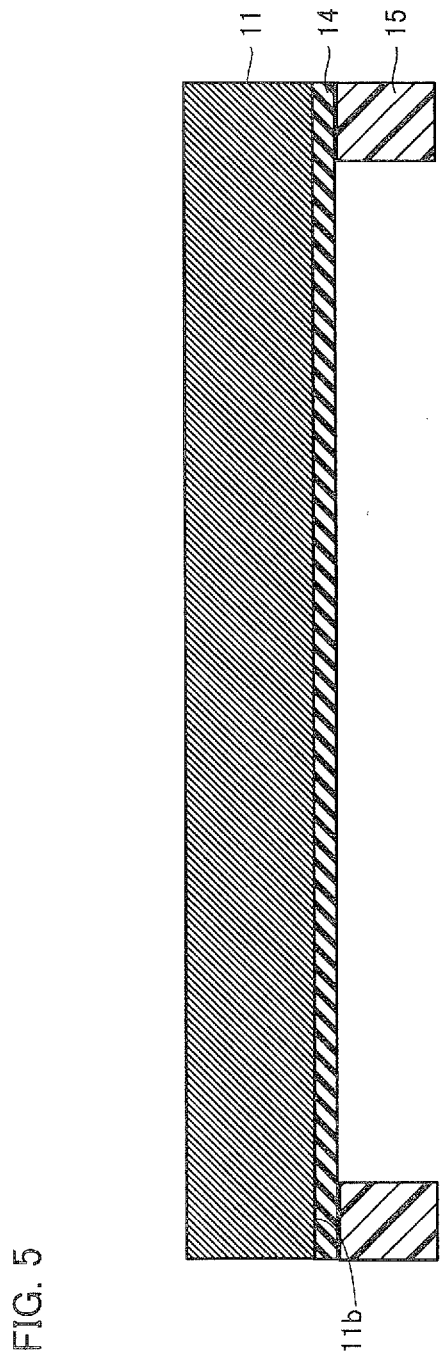
FIG. 5 is a cross-sectional view showing the first step of the modification of the step shown in FIG. 4.

Referring to FIG. 5, mask layer 14 made of a silicon dioxide film or a silicon nitride film is formed on the entire reverse side 11b of the Si substrate 11. Subsequently, on the mask layer 14, photoresist 15 with patterning in the required shape is formed.

Figure 6:
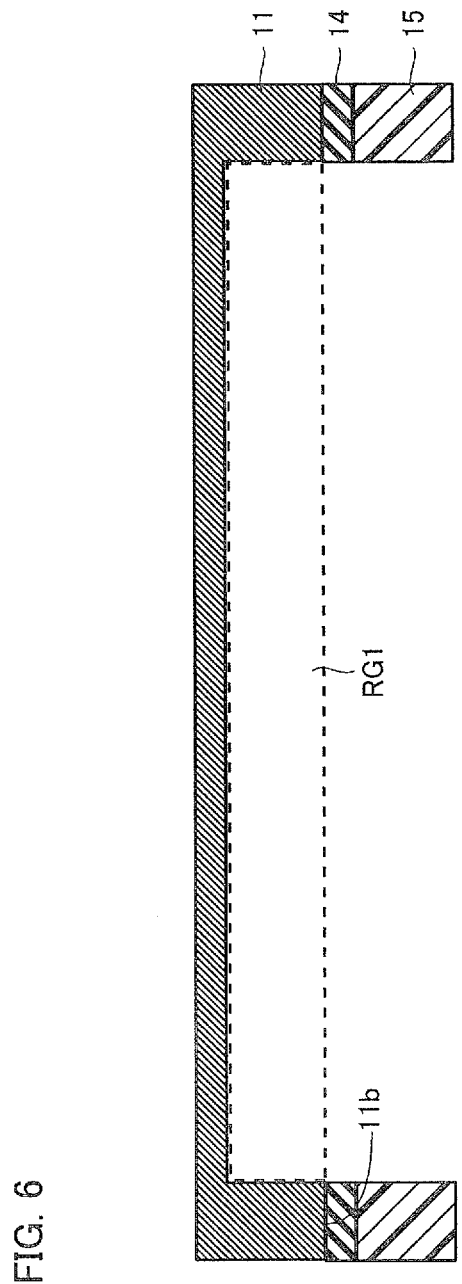
FIG. 6 is a cross-sectional view showing the second step of the modification of the step shown in FIG. 4.

Next, referring to FIG. 6, mask layer 14 is patterned by wet etching with photoresist 15 as a mask. As a result, only the peripheral part of mask layer 14 is left. When mask layer 14 is composed of a silicon dioxide film, a hydrofluoric acid solution or the like is used as the liquid chemical for wet etching of the mask layer 14. When mask layer 14 is composed of a silicon nitride film, a phosphoric acid solution or the like is used as the liquid chemical for wet etching of the mask layer 14. Subsequently, Si of central part RG1 is removed by wet etching using mixed acid or the like, with mask layer 14 patterned as a mask. Thereafter, photoresist 15 and mask layer 14 are removed. Incidentally, the photoresist 15 may be removed before wet etching of Si.

In the step shown in FIG. 3, the step in which the mask layer 14 shown in FIG. 5 is formed may be omitted by preparing a substrate on which the mask layer 14 was formed in advance on the reverse side 11b of the Si substrate 11. As the mask layer 14, an oxide film or a nitride film other than a silicon dioxide film and a silicon nitride film may be used.

Figure 7:
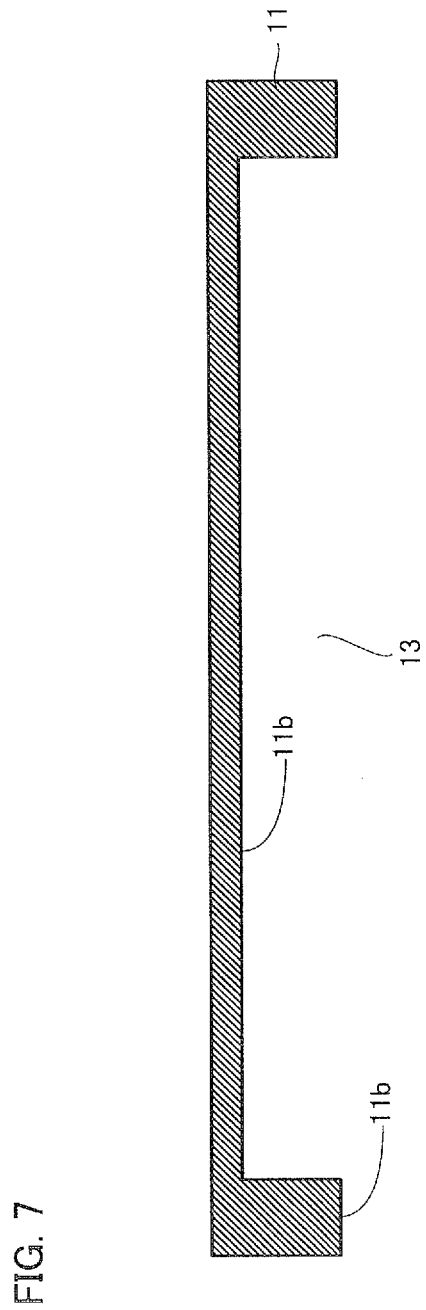
FIG. 7 is a cross-sectional view showing the third step of the method for manufacturing of substrate 1 in the first embodiment of the present invention.

With reference to FIG. 7, as a result of removal of Si of central part RG 1, recessed part 13 is formed on reverse side 11b of Si substrate 11. In FIG. 7, the recessed part 13 has a depth which does not penetrate the Si substrate 11. The bottom surface of the recessed part 13 is made of Si. Due to the existence of recessed part 13, the thickness of the central part of Si substrate 11 (the length in the longitudinal direction in FIG. 7) is thinner than the thickness of the peripheral part of Si substrate 11. As an example, the Si substrate 11 has a ring-like shape. Its outer diameter is 100 millimeter. Its inner diameter is 80 millimeter.

Figure 8:
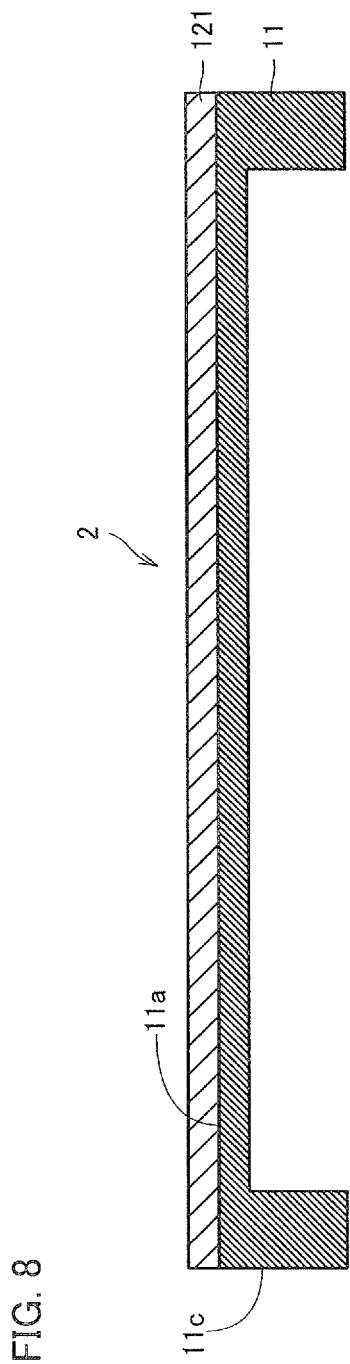
FIG. 8 is a cross-sectional view showing the fourth step of the method for manufacturing of the substrate 1 in the first embodiment of the present invention.

Referring to FIG. 8, after the recessed part 13 was formed, SiC film 121 is formed on surface 11a of Si substrate 11. The SiC film 121 is formed with a thickness of, for example, 10 nanometer or more and 160 nanometer or less (thickness of 160 nanometer as an example). Using the MBE (Molecular Beam Epitaxy) method, the CVD (Chemical Vapor Deposition) method, or the like, SiC film 121 is formed on a foundation layer made of SiC obtained by carbonizing the surface 11a of Si substrate 11, for example. By only carbonizing surface 11a of Si substrate 11, the SiC film 121 may be formed. Further, by using the MBE method or the CVD method, the SiC film 121 may be formed on the surface 11a of the Si substrate 11. When forming the SiC film 121, SiC film 121 may also be formed on the side surface 11c of the Si substrate 11.

Figure 9:
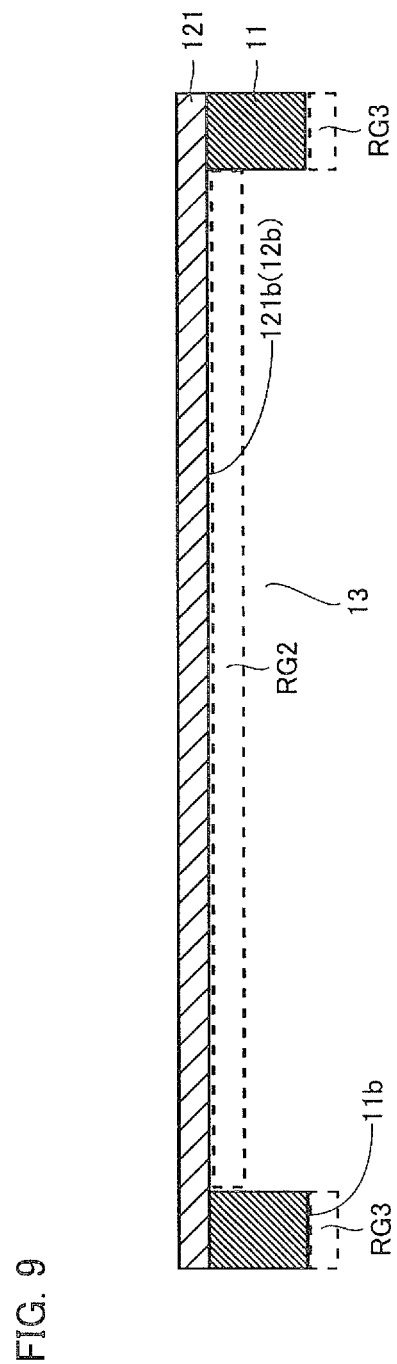
FIG. 9 is a cross-sectional view showing the fifth step of the method for manufacturing of the substrate 1 in the first embodiment of the present invention.

Referring to FIG. 9, subsequently, the bottom surface RG2 of the recessed part 13 of the Si substrate 11 is removed by wet etching. The bottom surface RG2 is at least a part of the Si substrate 11 contacting the SiC film 121. As a result of removal of Si in the bottom surface RG 2, reverse side 121b (reverse side 121b corresponds to reverse side 12b of SiC film 12) of SiC film 121 is exposed on the bottom of recessed part 13. Further, during the wet etching, Si of peripheral part RG3 of reverse side 11b of Si substrate 11 is removed with Si of bottom surface RG2. By adopting wet etching, it is possible to prevent damage to the SiC film 121 when removing the Si substrate.

The wet etching of Si on the bottom surface RG 2 is preferably performed by relatively moving Si substrate 11 and SiC film 121 with respect to liquid chemical used for wet etching. Movement of Si substrate 11 and SiC film 121 is done by the following methods, for example. A method is rotating Si substrate 11 and SiC film 121 without changing the positions of Si substrate 11 and SiC film 121. A method is changing the positions of Si substrate 11 and SiC film 121 (in other words, a method of moving Si substrate 11 and SiC film 121). A method is rotating Si substrate 11 and SiC film 121 while changing the positions of Si substrate 11 and SiC film 121. As liquid chemical used for wet etching of Si, for example, mixed acid including hydrofluoric acid and nitric acid, potassium hydroxide (KOH) aqueous solution, or the like is used.

When an alkaline solution such as potassium hydroxide aqueous solution is used as liquid chemical for wet etching of Si, SiC film 121 may be etched through pinholes present in low density in SiC film 121. In order to prevent the SiC film 121 from being etched and improve the quality of the SiC film 121, it is preferable to use the above-mentioned mixed acid as liquid chemical for wet etching of Si.

The direction of moving Si substrate 11 and SiC film 121 during wet etching of Si is arbitrary. However, in order to avoid the situation where the SiC film 121 is damaged by the pressure received from the liquid chemical while moving the Si substrate 11 and the SiC film 121, as in the first to third methods below, it is preferable to move Si substrate 11 and SiC film 121 in a direction within a plane parallel to surface 121*a* of SiC film 121 (plane PL in FIG. 10 to FIG. 12).

Figure 10:
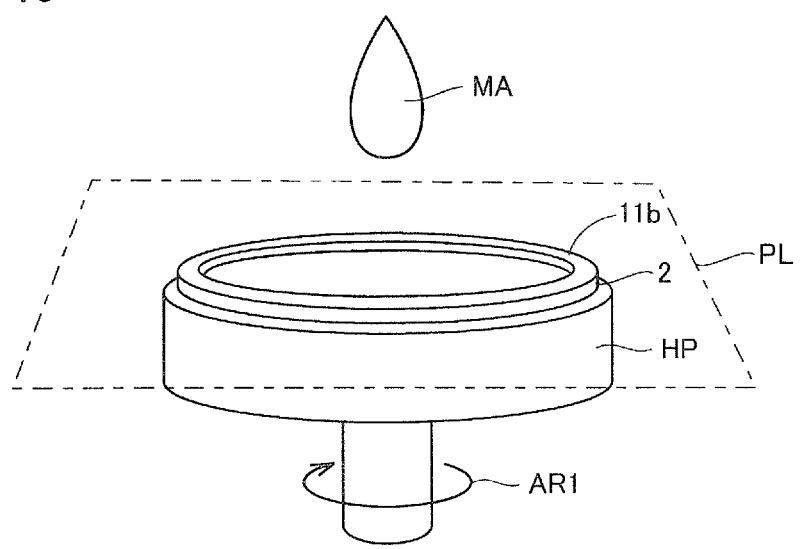
FIG. 10 is a view schematically showing the first method of wet etching of Si in the first embodiment of the present invention.
Figure 11:
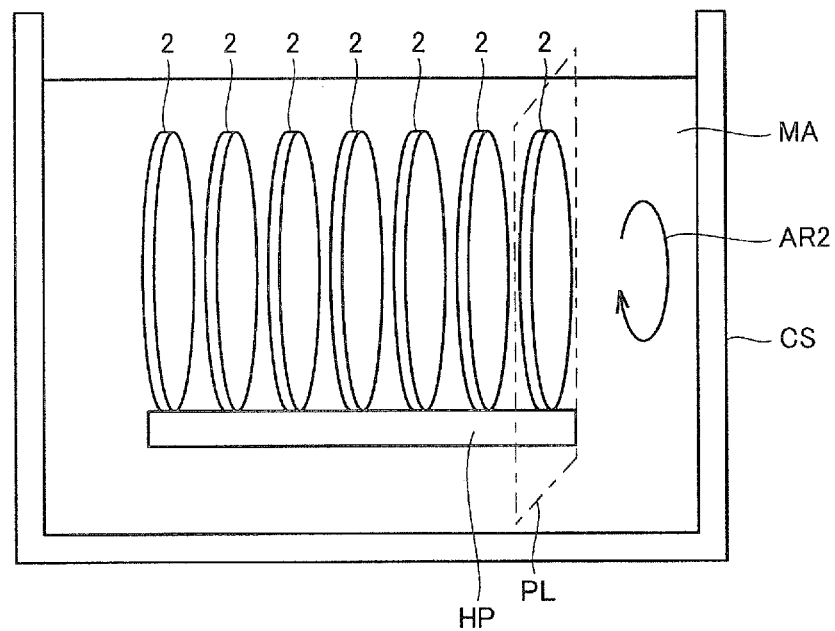
FIG. 11 is a view schematically showing the second method of wet etching of Si in the first embodiment of the present invention.
Figure 12:
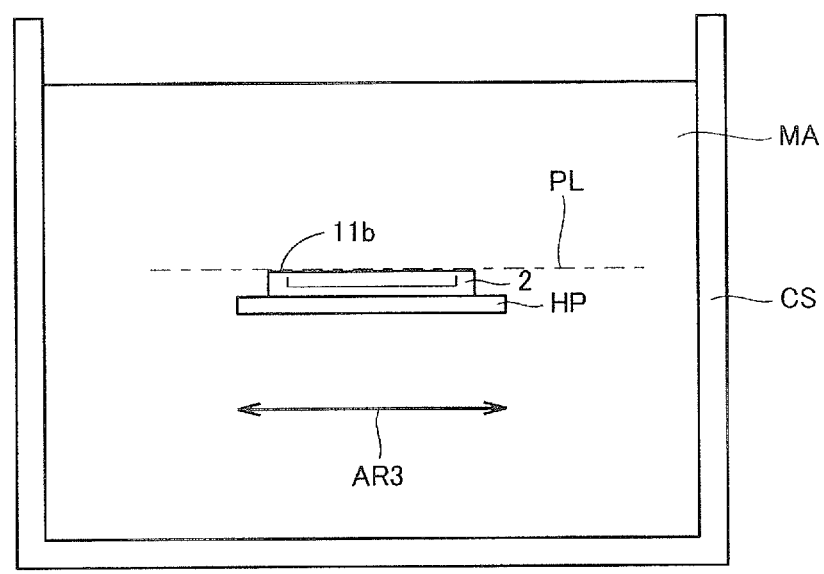
FIG. 12 is a view schematically showing the third method of wet etching of Si in the first embodiment of the present invention.

FIG. 10 to FIG. 12 are diagrams schematically showing the first to third methods of wet etching of Si in the first embodiment of the present invention. In the description for FIG. 10 to FIG. 12, the structure immediately before wet etching of Si is explained as intermediary body 2. In the present embodiment, the structure immediately after the step of FIG. 8 corresponds to intermediary body 2. In the second embodiment described later, the structure immediately after the step of FIG. 20 corresponds to intermediary body 2.

Referring to FIG. 10, the first method is a method of removing Si by spin etching. In the first method, intermediary body 2 is fixed to holding platform HP, so that reverse side 11*b* of Si substrate 11 faces upward. Then, as indicated by the arrow AR1, holding platform HP is rotated about the rotation axis extending in the direction orthogonal to reverse side 11*b*. In this way, with intermediary body 2 being rotated without changing the position of intermediary body 2, liquid chemical MA (etching solution) used for wet etching is injected onto reverse side 11*b* of Si substrate 11. The rotation speed of holding platform HP is set to about 500 to 1500 rpm, for example.

Referring to FIG. 11, in the second method, a plurality of intermediary bodies 2 are fixed to holding platform HP in the upright state. Then, the plurality of intermediary body 2 are immersed in the liquid chemical MA filled in the reaction vessel CS. In the plane PL parallel to the surface 121*a* of the SiC film 121, as indicated by an arrow AR 2, intermediary bodies 2 and holding platform HP are rotated while changing the positions of intermediary bodies 2.

Referring to FIG. 12, in the third method, intermediary body 2 is fixed to holding platform HP as the reverse side 11*b* of the Si substrate 11 faces upward. The intermediary body 2 is immersed in the liquid chemical MA filled in the reaction vessel CS. In the plane PL parallel to the surface 121*a* of the SiC film 121, intermediary body 2 and holding platform HP are reciprocated on a straight line, as indicated by the arrow AR3.

Figure 13:
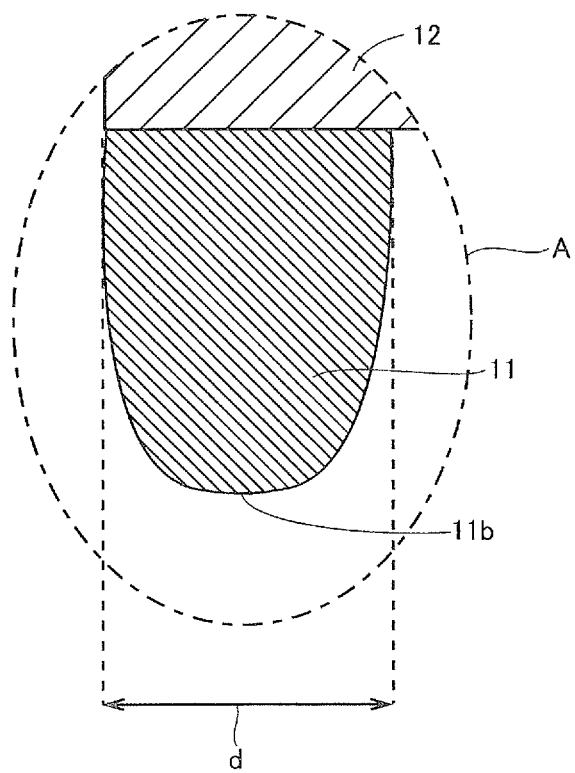
FIG. 13 is an enlarged view of a portion A in the substrate 1 shown in FIG. 1.

FIG. 13 is an enlarged view of part A of substrate 1 shown in FIG. 1. In FIG. 13, the amount of change in the width of the Si substrate 11 is emphasized more than the actual one.

Referring to FIG. 13, mixed acid including hydrofluoric acid and nitric acid has an effect of isotropically etching Si. For this reason, when Si is wet-etched using mixed acid including hydrofluoric acid and nitric acid as liquid chemical, the width d (the length in the lateral direction in FIG. 13) of the Si substrate 11 decreases with increasing distance from the SiC film 12 (from the SiC film 12 to the reverse side 11*b* of the Si substrate 11), as a trace of it.

Figure 14:
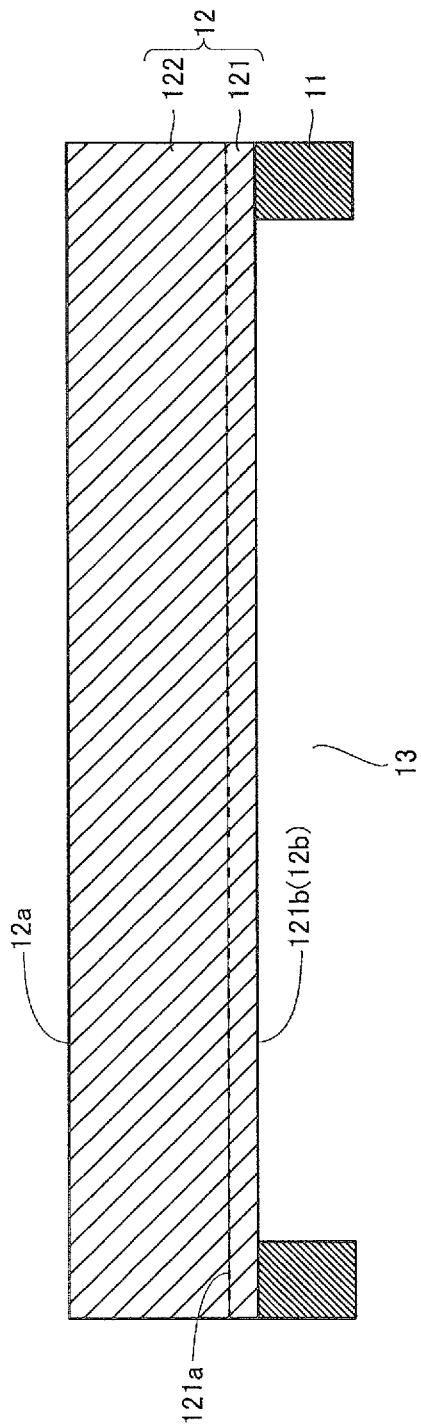
FIG. 14 is a cross-sectional view showing the sixth step of the method for manufacturing of the substrate 1 in the first embodiment of the present invention.

Referring to FIG. 14, after wet etching of Si of the bottom surface RG2, SiC film 122 is formed on surface 121*a* of SiC film 121 (SiC film 122 is homoepitaxial grown). SiC film 122 is formed using the MBE method, the CVD method, or the like. SiC film 12 is constituted by the SiC film 121 of the lower layer and the SiC film 122 of the upper layer. With the above steps, the substrate 1 shown in FIG. 1 is completed.

SiC film 122 is preferably formed by the film forming condition below.

Figure 15:
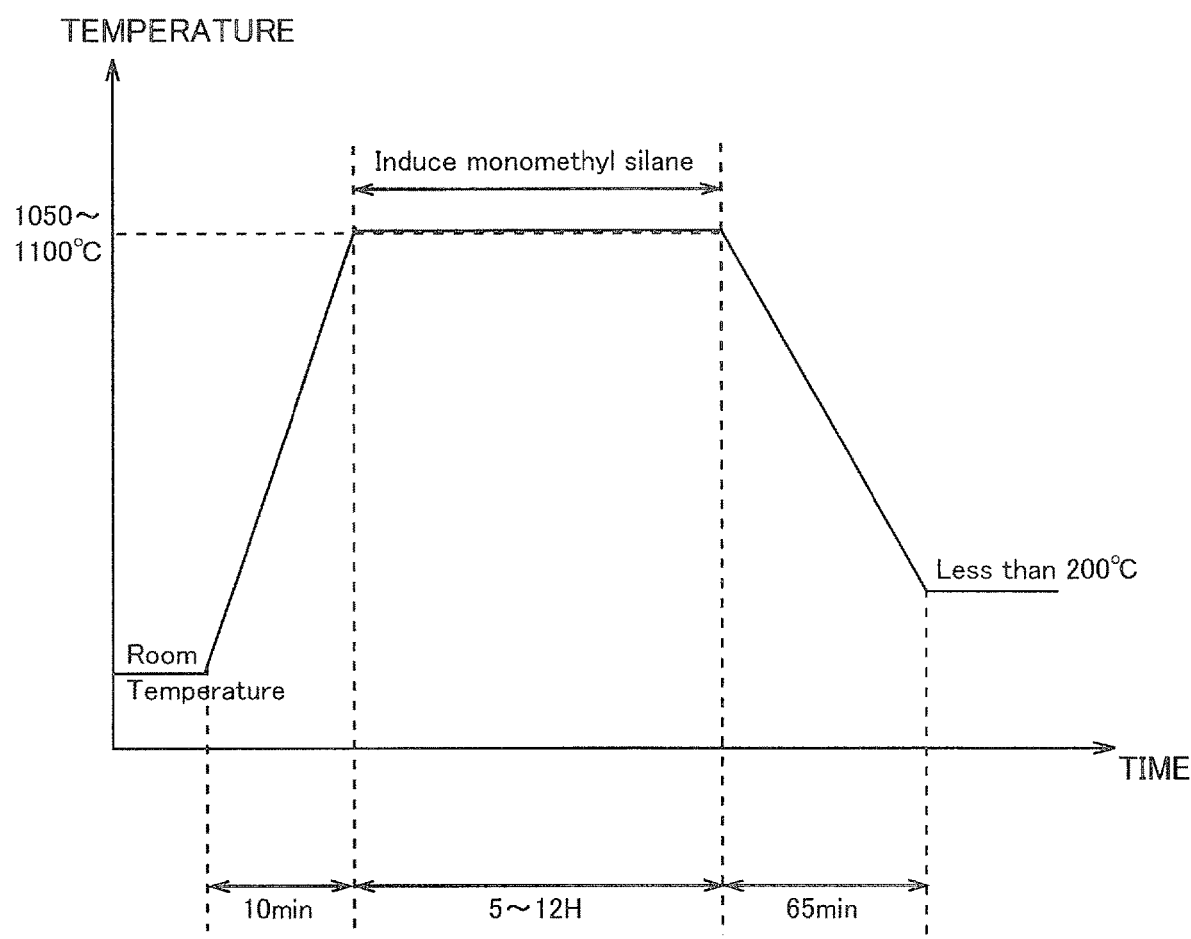
FIG. 15 is a graph illustrating an example of the film forming condition of the SiC film 122 in the first embodiment of the present invention.

FIG. 15 is a graph illustrating an example of the film forming condition of the SiC film 122 in the first embodiment of the present invention.

Referring to FIG. 15, for example, after the Si substrate 11 has been heated from room temperature to the film forming temperature in 10 minutes, the SiC film 121 is formed at a temperature of 1050 to 1100 degrees Celsius in 5 to 12 hours. As source gas, for example, monomethyl silane is used. The flow rate of the source gas is, for example, 20 to 30 sccm. The pressure at the time of film forming is, for example, 0.02 to 0.03 Pa.

Figure 16:
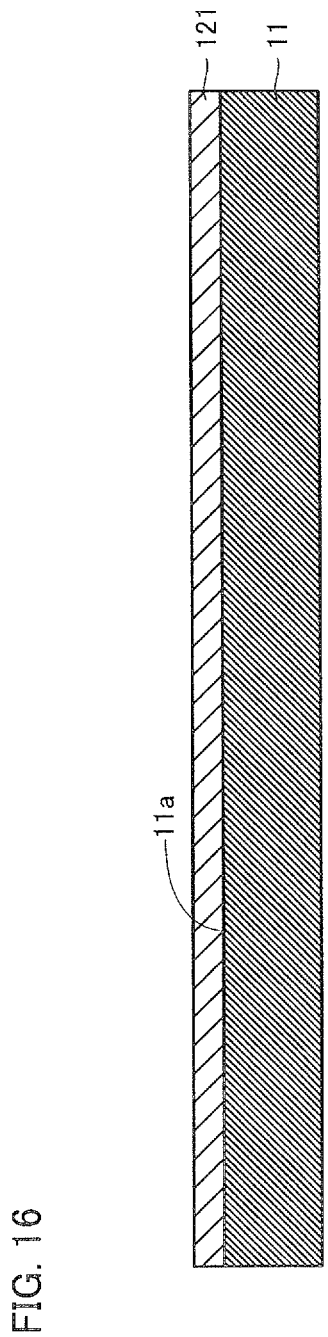
FIG. 16 is a cross-sectional view showing the first step of the modification of the method for manufacturing of substrate 1 in the first embodiment of the present invention.
Figure 17:
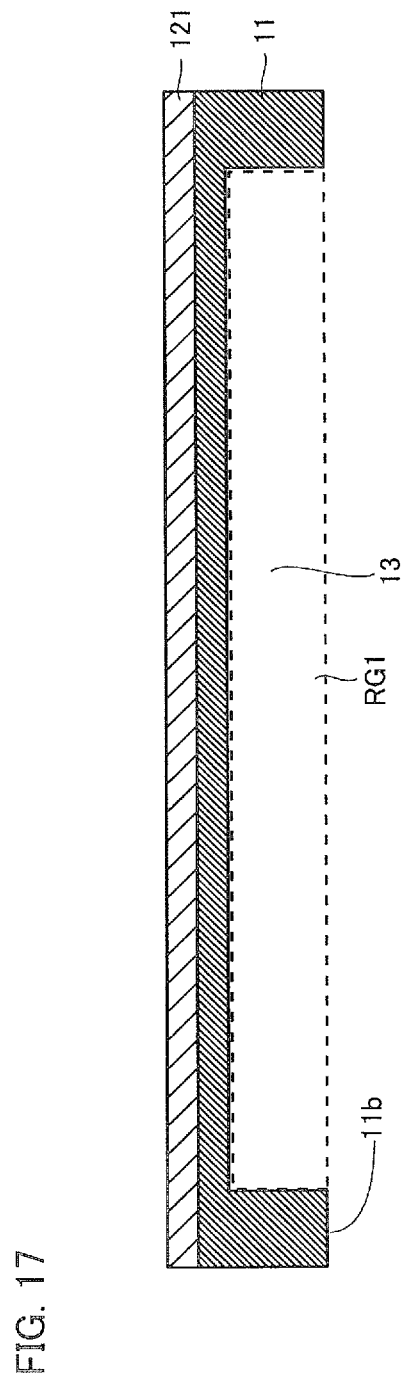
FIG. 17 is a cross-sectional view showing the second step of the modification of the method for manufacturing of substrate 1 in the first embodiment of the present invention.

As the modification of the manufacturing method of this embodiment, as shown in FIG. 16, after forming the SiC film 121 on surface 11*a* of Si substrate 11, as shown in FIG. 17, Si of central part RG1 of reverse side 11*b* of Si substrate 11 is removed to form recessed part 13. Thereafter, the bottom surface RG2 of the recessed part 13 may be removed by wet etching.

According to the present embodiment, the occurrence of warpage in substrate 1 can be suppressed.

Figure 18:
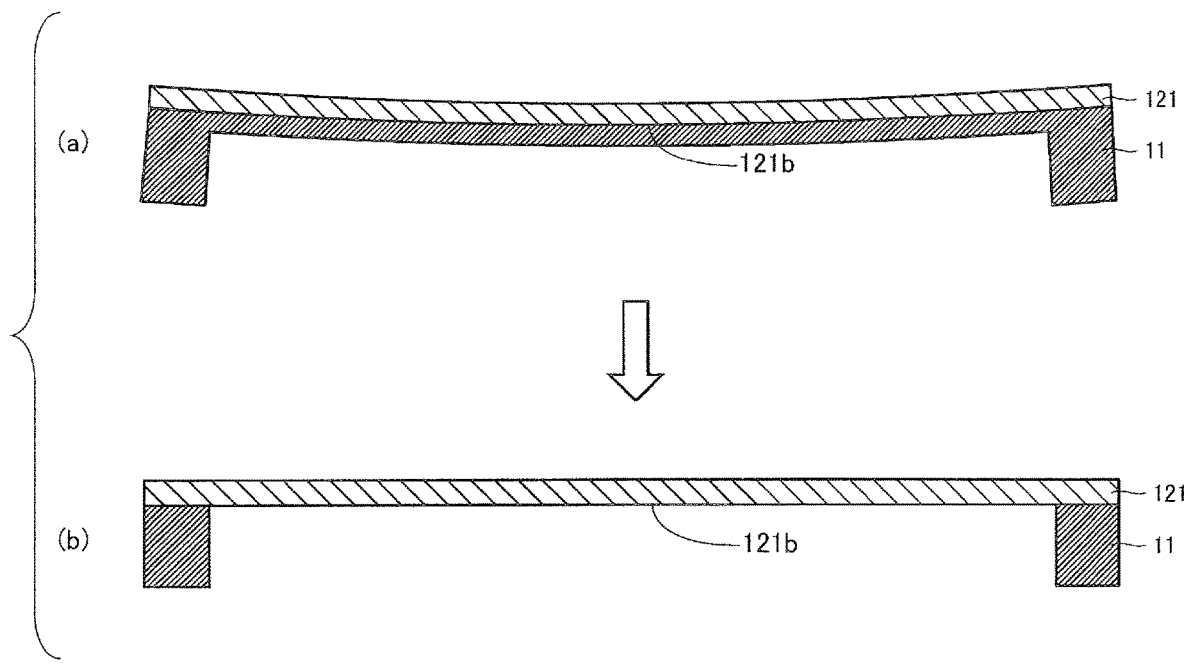
FIG. 18 is a cross-sectional view illustrating the effect of the first embodiment of the present invention.

FIG. 18 is a cross-sectional view illustrating the effect of the first embodiment of the present invention. FIG. 18 (*a*) is a diagram schematically showing the state of the Si substrate 11 and the SiC film 121 immediately after forming the SiC film 121 (immediately after finishing the step shown in FIG. 8). FIG. 18 (*b*) is a diagram schematically showing the state of Si substrate 11 and SiC film 121 immediately after wet etching of Si on the bottom surface RG 2 (immediately after finishing the step shown in FIG. 9). In FIG. 18 (*a*), the warpage of Si substrate 11 and SiC film 121 is shown larger than the actual warpage, for the sake of convenience of explanation.

With reference to FIG. 18 (*a*), immediately after forming the SiC film 121, the entire reverse side 121*b* of the SiC film 121 is in contact with the Si substrate 11. In this state, due to the difference between physical properties (the lattice constants and the thermal expansion coefficients) of Si and SiC, Si substrate 11 and SiC film 121 mutually exert force on each other. As a result, in the Si substrate 11 and the SiC film 121, warpage which is convex towards the Si substrate 11 side (lower side in FIG. 18 (*a*)) is generated.

With reference to FIG. 18 (*b*), when a part of the Si substrate 11 (Si on the bottom surface RG2) is removed, the portion of the SiC film 121 (the central part in FIG. 18 (*b*)) which was in contact with the portion from which the Si substrate 11 has been removed is released from the force received from the Si substrate 11. As a result, Si substrate 11 and SiC film 121 are planarized. The SiC free-standing substrate (the partial free-standing substrate) with small warpage can be obtained.

In addition, according to the present embodiment, during wet etching of Si substrate 11, Si substrate 11 and SiC film 121 are moved with respect to liquid chemical of wet etching. This makes it possible to prevent cracks from entering the SiC film 121 during the wet etching of the Si substrate 11. Also, this makes it possible to prevent peeling off of the SiC film 121 from the Si substrate 11.

The inventors of the present application have found the reason why cracks enter the SiC film 121 or SiC film 121 is peeled off from the Si substrate 11, during conventional wet etching of Si substrate 11 (during immersion of Si substrate 11 in liquid chemical). The inventors of the present application have found that liquid chemical after reaction locally stays on the reaction surface of Si substrate 11 (the surface of the part reacting with liquid chemical on reverse side 11*b* of Si substrate 11). As a result, the etching rate of Si becomes nonuniform, causing roughness on the reaction surface of Si substrate 11. The inventors of the present application also found out the followings. When mixed acid is used as liquid chemical for wet etching, large bubbles generated by the reaction of liquid chemical and Si locally stay on the reaction surface of Si substrate 11. The bubbles locally hinder the reaction of the reaction surface of Si substrate 11 with liquid chemical. This causes roughness on the reaction surface of Si substrate 11.

If the SiC film 121 is relatively thick (for example, when its thickness is greater than 10 micrometer), the mechanical strength of the SiC film 121 itself is high. For this reason, the roughness of the reaction surface of Si substrate 11 does not exert a so bad influence on SiC film 121. However, in the case where the SiC film 121 is relatively thin (for example, when its thickness is 10 micrometer or less, or more specifically when it is a thin film (the thickness is only about several micrometers) or an extremely thin film (the thickness is equal to or less than 100 nanometer order)), roughness of the reaction surface of Si substrate 11 exerts an adverse effect on SiC film 121. That is, uneven stress is applied to SiC film 121, due to the roughness of the reaction surface of Si substrate 11. This causes cracks entering the SiC film 121 and peeling off of the SiC film 121 from the Si substrate 11, during the Si etching.

Therefore, according to the present embodiment, during wet etching of Si substrate 11, Si substrate 11 and SiC film 121 are moved relatively with respect to liquid chemical of wet etching. As a result, liquid chemical and bubbles after the reaction are prevented from locally staying on the reaction surface of Si substrate 11. It makes possible to suppress roughness of the reaction surface of Si substrate 11. As a result, it makes possible to prevent uneven stress from being applied to the SiC film 121, so that film thinning of SiC film 121 can be attempted.

In particular, when a method of removing Si by spin etching (the first method shown in FIG. 10) is adopted as a method of wet etching of Si, the SiC film 121 is exposed to liquid chemical during wet etching, only while the reverse side 121b of the SiC film 121 is exposed at the bottom of the recessed part 13. Also, surface 121a of SiC film 121 is not exposed to liquid chemical during the wet etching. Therefore, damage of SiC film 121 caused by the liquid chemical can be minimized.

Also, by using mixed acid as liquid chemical for wet etching of Si, it is possible to prevent damage caused by liquid chemical to SiC film 121. As a result, the yield of the SiC film 121 can be improved, and the SiC film can be formed in a large area.

Second Embodiment

Figure 19:
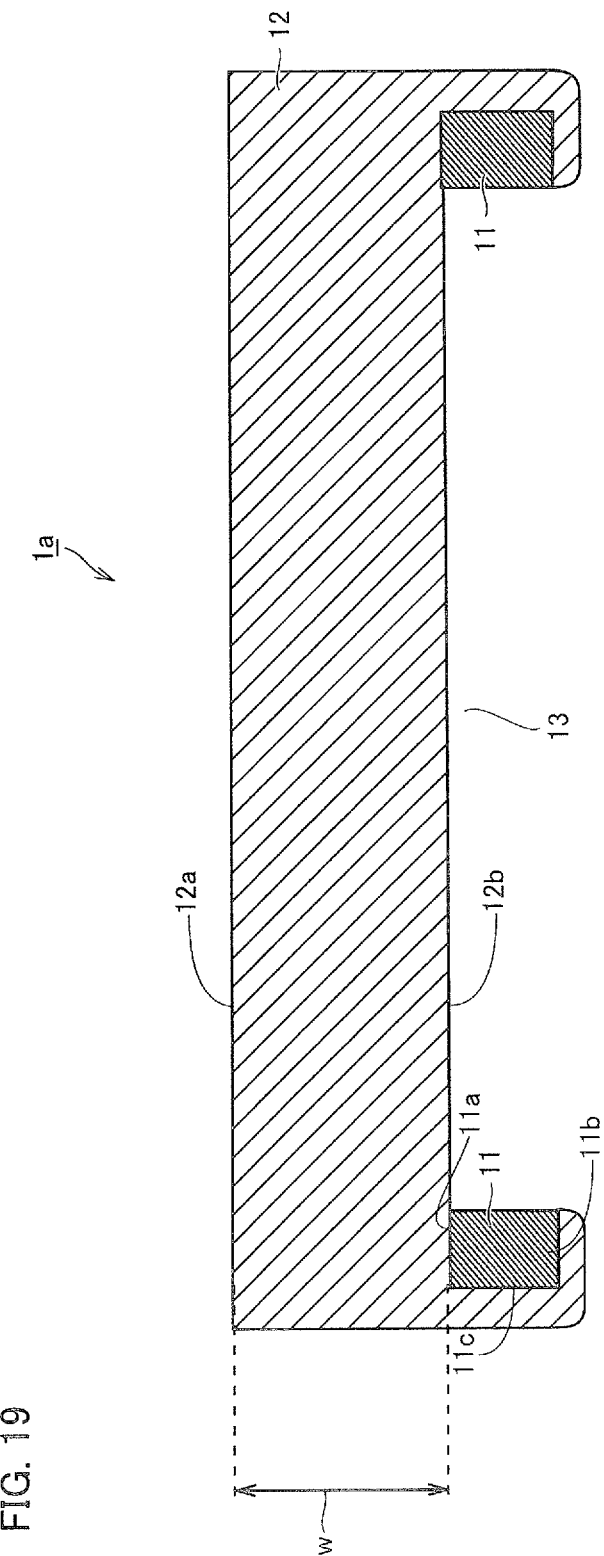
FIG. 19 is a cross-sectional view showing a configuration of substrate 1a according to the second embodiment of the present invention.

FIG. 19 is a cross-sectional view showing a configuration of the substrate 1a in the second embodiment of the present invention. Note that FIG. 19 shows the cross-sectional view in the case of cutting with a plane perpendicular to the surface 12a of the SiC film 12.

Referring to FIG. 19, according to the substrate 1a of the present embodiment, the SiC film 12 is formed on the surface 11a, the side surface 11c, and the peripheral part of the reverse side 11b of Si substrate 11. The surface 11a, the side surface 11c, and the peripheral part of the reverse side 11b of Si substrate 11 is completely covered by continuous SiC film 12. At the bottom of the recessed part 13, the reverse side 12b of the SiC film 12 is exposed. SiC film 12 on the surface 11a is thicker than SiC film 12 on the side surface 11c and the reverse side 11b. The portion of the SiC film 12 formed on the surface 11a of the Si substrate has a thickness w of 20 micrometer or more and 500 micrometer or less.

Next, the method for manufacturing of the substrate 1a in the present embodiment will be described with reference to FIG. 20 to FIG. 23.

Figure 20:
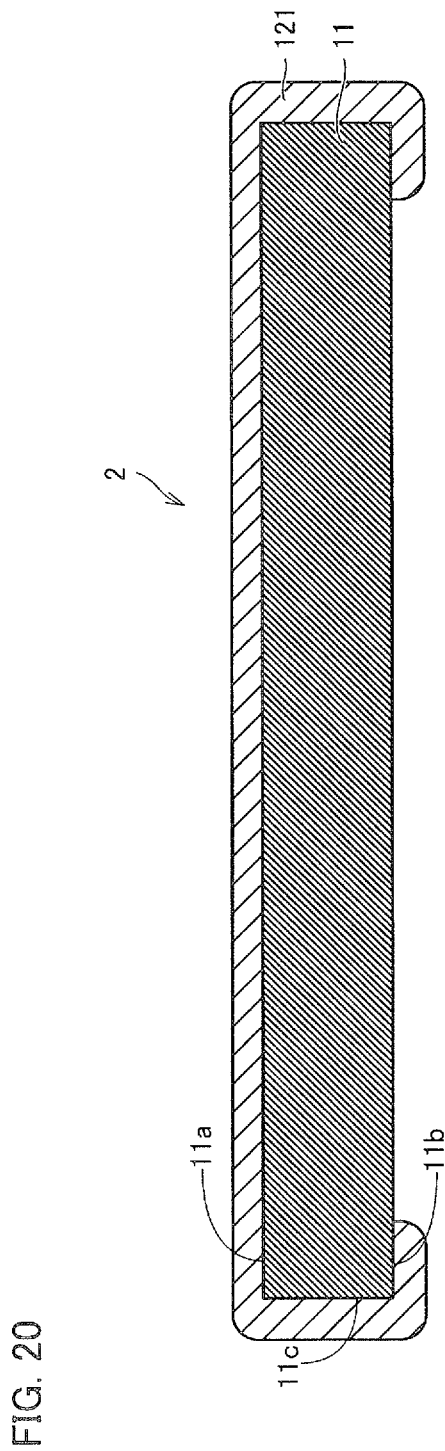
FIG. 20 is a cross-sectional view showing the first step of the method for manufacturing of substrate 1a in the second embodiment of the present invention.

Referring to FIG. 20, with respect to the Si substrate 11 shown in FIG. 3, SiC film 121 is formed by using the CVD method. When the SiC film 121 is formed, the Si substrate 11 is held so that a part of the source gas supplied to the surface 11a of the Si substrate 11 also goes to the side surface 11c and the reverse side 11b of the Si substrate 11. This causes the chemical reaction of the source gas to occur also on the surface 11a, the side surface 11c, and the peripheral part of the reverse side 11b of Si substrate 11. The continuous SiC film 121 is formed on the surface 11a, the side surface 11c, and the peripheral part of the reverse side 11b of Si substrate 11. As a result, intermediary body 2 in this embodiment is obtained.

Figure 21:
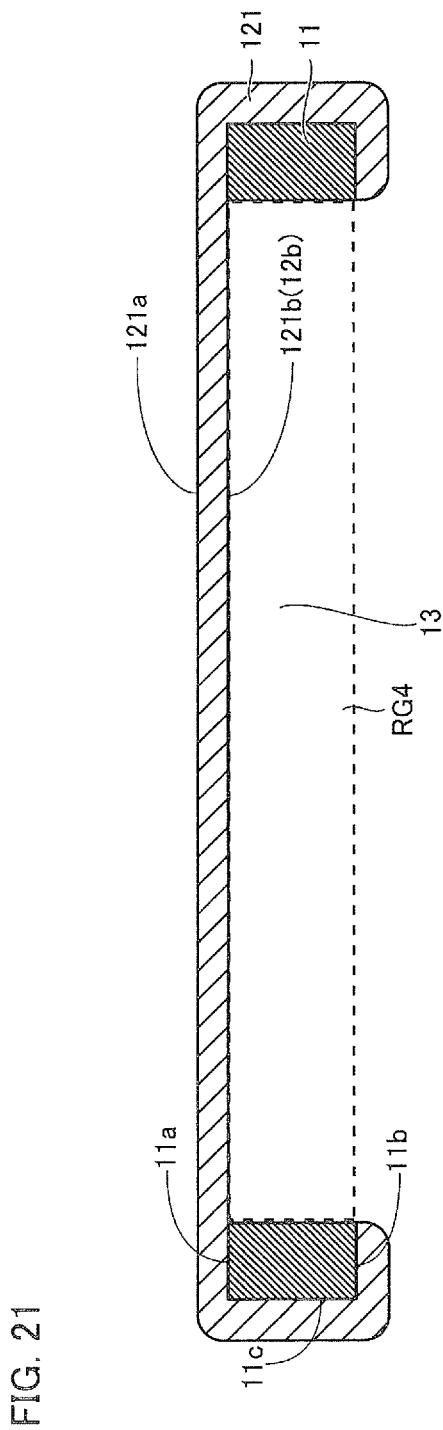
FIG. 21 is a cross-sectional view showing the second step of the method for manufacturing of substrate 1a in the second embodiment of the present invention.

Subsequently, referring to FIG. 21, with the SiC film 121 formed at the peripheral part of reverse side 11b of Si substrate 11 as a mask, the exposed central part RG4 of reverse side 11b of Si substrate 11 is removed by wet etching. As a result of removing Si of central part RG4, recessed part 13 is formed on reverse side 11b of the Si substrate. The reverse side 121b of SiC film 121 is exposed on the bottom surface of recessed part 13. During this wet etching, the Si of the peripheral part covered with SiC film 121 on reverse side 11b of Si substrate 11 is not removed.

Figure 22:
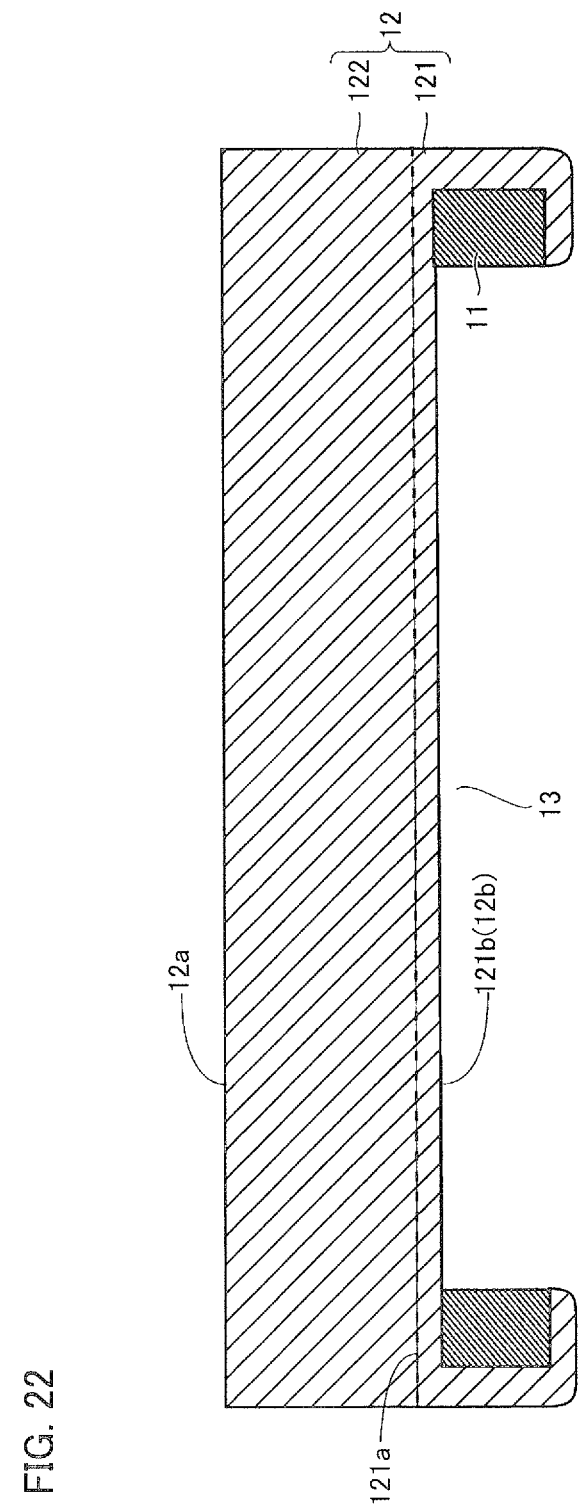
FIG. 22 is a cross-sectional view showing the third step of the method for manufacturing of substrate 1a in the second embodiment of the present invention.

Referring to FIG. 22, after the wet etching of Si of central part RG4, SiC film 122 is formed on surface 121a of SiC film 121 (The SiC film 122 is homoepitaxially grown). SiC film 122 is formed using the MBE method, the CVD method, or the like. The SiC film 12 is constituted by the SiC film 121 of the lower layer and the SiC film 122 of the upper layer. By the above steps, the substrate 1a shown in FIG. 19 is completed.

In the step shown in FIG. 20 (the step in which the SiC film 121 is formed by the CVD method), Si substrate 11 is preferably held in the CVD apparatus, by the following way.

Figure 23:
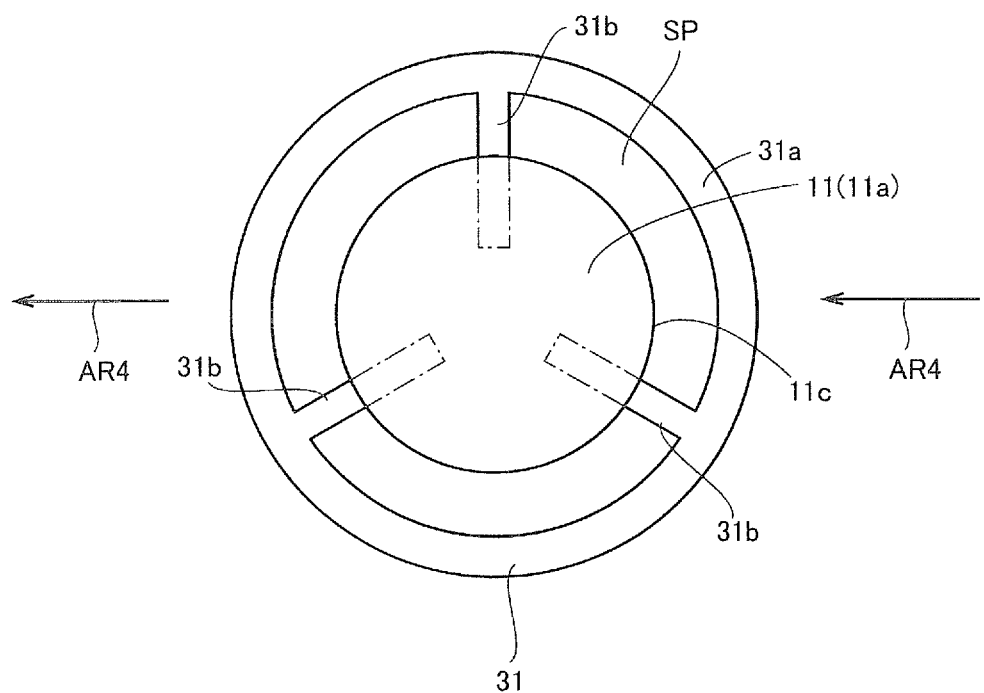
FIG. 23 is a plan view showing an example of a method of holding Si substrate 11 in a CVD apparatus, according to the second embodiment of the present invention.

FIG. 23 is a plan view showing an example of a method of holding the Si substrate 11 in the CVD apparatus, according to the second embodiment of the present invention.

Referring to FIG. 23, the CVD apparatus includes retaining part 31 for holding the Si substrate 11. The retaining part 31 includes a ring-like peripheral part 31a, and a plurality (three in this case) of protrusions 31b provided at equal intervals in the inner peripheral side end portion of the peripheral part 31a. Each of the plurality of protrusions 31b is linear and protrudes toward the center of the peripheral part 31a. The Si substrate 11 is placed on the tip of each of the plurality of protrusions 31b, so that the surface 11a faces upward. The reactant gas is flowed in the direction indicated by the arrow AR4 on the surface 11a of the Si substrate 11. Through the space SP between the peripheral part 31a and the plurality of protrusions 31b, a part of the reactant gas goes around the side surface 11c and the reverse side 11b of the Si substrate 11. As a result, continuous SiC film 121 is formed on surface 11a, side surface 11c, and the peripheral part of reverse side 11b of Si substrate 11.

The configurations and the method for manufacturing of the substrate 1a other than the above are the same as those of the substrate 1 in the first embodiment. Therefore, the description thereof will not be repeated.

According to the present embodiment, it is possible to obtain the same effect as in the first embodiment. In addition, it is possible to wet-etch the Si substrate 11 with the SiC film 121 formed by going around the reverse side 11b of the Si substrate 11 as a mask. It is unnecessary to form a recessed part on the Si substrate 11 with a step different from the step in which the SiC film 121 is formed, and it is unnecessary to form a pattern by lithography. As a result, it is possible to manufacture the substrate 1a by a simple method, and to manufacture the substrate 1a in a short period of time and at low cost.

Third Embodiment

Figure 24:
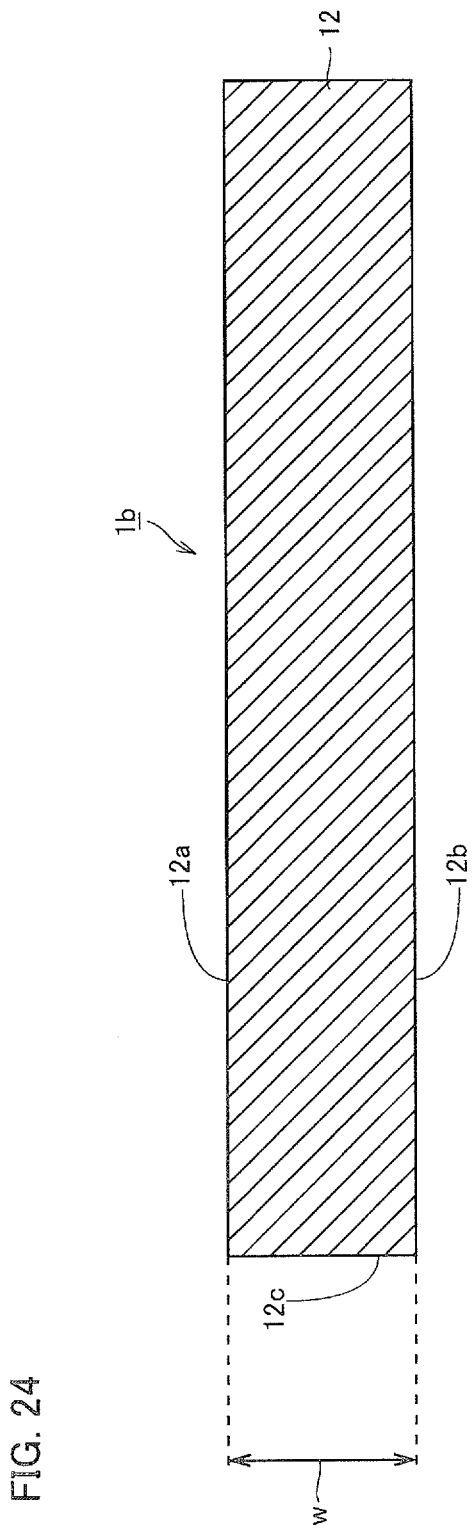
FIG. 24 is a cross-sectional view showing a configuration of substrate 1b according to the third embodiment of the present invention.

FIG. 24 is a cross-sectional view showing the configuration of the substrate 1b in the third embodiment of the present invention. Note that FIG. 24 shows a cross-sectional view in the case of cutting with a plane perpendicular to the surface 12a of the SiC film 12.

Referring to FIG. 24, the substrate 1b in the present embodiment is a complete free-standing SiC substrate that is not supported by a Si substrate. After completion of the substrate 1 (FIG. 1) in the first embodiment, Si substrate 11 is completely-removed from reverse side 12b of SiC film 12 using nitrohydrofluoric acid or the like, to form the substrate 1b.

The configuration and the method for manufacturing of the substrate 1b other than the above are the same as those of substrate 1 in the first embodiment. The same reference numerals are given for the same members, and the descriptions thereof will not be repeated.

The SiC film 12 is thickened by the SiC film 122 and has sufficient mechanical strength. Therefore, the SiC film 12 will not be damaged even if the Si substrate 11 is removed. Actually, the inventor manufactured the substrate 1b and measured its warpage. The warpage of substrate 1b was suppressed to a very low value of 30 micrometer or less.

Others

In the above-described embodiments, the case where Si on the bottom surface of the recessed part 13 is removed by wet etching has been described. In the present invention, the portion removed by wet etching may be at least a part of the other principal surface of Si substrate. The position, size, and shape of the part to be removed are arbitrary. In addition, the method of removing Si on the bottom surface of the recessed part 13 is arbitrary. It may be dry etching or the like.

The above-described embodiments can be combined with each other. For example, by combining the second embodiment with the third embodiment, a SiC free-standing substrate may be manufactured by removing the Si substrate 11 and the SiC film 12 formed on the reverse side 11b of the Si substrate 11.

It is to be understood that the above-described embodiments and examples are illustrative in all respects and not restrictive. The scope of the present invention is defined not by the above descriptions but by the scope of the claims, and it is intended that all modifications within the scope equivalent to the claims are included.

INDUSTRIAL APPLICABILITY

The present invention is applicable to, for example, an a method for manufacturing a substrate including a step in which a SiC film is formed.

EXPLANATION OF REFERENCE NUMERALS 1, 1a, 1b substrate
2 intermediary body
11 Si substrate
11a surface of Si substrate
11b reverse side of Si substrate
11c side surface of Si substrate
12, 121, 122 SiC film
12a, 121a surface of SiC film
12b, 121b reverse side of SiC film
12c side surface of SiC film
13 recessed part
14 mask layer
15 photoresist
31 retaining part
31a peripheral part of retaining part
31b protrusions of retaining part
CS reaction vessel
HP holding platform
MA liquid chemical
PL plane parallel to surface of SiC film
RG1 central part of reverse side of Si substrate
RG2 bottom of recessed part of Si substrate
RG3 reverse side peripheral part of Si substrate
RG4 exposed central part of reverse side of Si substrate
SP space between peripheral part and multiple protrusions in retaining part

What is claimed is:

1. A method for manufacturing a substrate comprising steps of:
   forming a SiC film on one of principal surfaces of a Si substrate,
   removing at least a part of the Si substrate in contact with the SiC film, and
   forming another SiC film on one of principal surfaces of the SiC film, after the step of removing at least a part of the Si substrate.

2. The method for manufacturing a substrate according to claim 1, wherein
   at least a part of another of the principal surfaces of the Si substrate is removed by wet etching, in the step of removing at least a part of the Si substrate, and
   the Si substrate and the SiC film are relatively moved with respect to liquid chemical used for the wet etching.

3. The method for manufacturing a substrate according to claim 2, wherein
   the Si substrate and the SiC film are moved in a direction in a plane parallel to the one of the principal surfaces of the SiC film, in the step of removing at least a part of the Si substrate.

4. The method for manufacturing a substrate according to claim 3, wherein
   liquid chemical used for the wet etching is injected onto the another of the principal surfaces of the Si substrate, in a state where the Si substrate and the SiC film are rotated, in the step of removing at least a part of the Si substrate.

5. The method for manufacturing a substrate according to claim 2, further comprises a step of:
   forming a recessed part having Si as a bottom surface at a central part of the another of the principal surfaces of the Si substrate, wherein
   the SiC film is exposed on the bottom surface of the recessed part in the step of removing at least a part of the Si substrate.

6. The method for manufacturing a substrate according to claim 5, wherein
   the step of forming the SiC film on the one of the principal surfaces of the Si substrate is performed, after the step of forming the recessed part at the central part of the another of the principal surfaces of the Si substrate.

7. The method for manufacturing a substrate according to claim 5, wherein
the step of forming the recessed part at the central part of the another of the principal surfaces of the Si substrate is performed, after the step of forming the SiC film on the one of the principal surfaces of the Si substrate.

8. The method for manufacturing a substrate according to claim 5, wherein
the central part of the another of the principal surfaces of the Si substrate is removed by wet etching, with a mask layer made of a oxide film or a nitride film formed on the another of the principal surfaces of the Si substrate as a mask, in the step of forming the recessed part at the central part of the another of the principal surfaces of the Si substrate.

9. The method for manufacturing a substrate according to claim 2, wherein
the SiC film is formed on the one of the principal surfaces and a side surface of the Si substrate and on the peripheral part of the another of the principal surfaces of the Si substrate, in the step of forming the SiC film, and
the another of principal surfaces of the Si substrate is removed, with the SiC film formed on the peripheral part of the another of the principal surfaces of the Si substrate as a mask, in the step of removing at least a part of the Si substrate.

10. The method for manufacturing a substrate according to claim 2, wherein
mixed acid including hydrofluoric acid and nitric acid is used as liquid chemical used for the wet etching, in the step of removing at least a part of the Si substrate.

11. The method for manufacturing a substrate according to claim 1, further comprises a step of:
removing the Si substrate completely, after the step of forming the another SiC film.

\* \* \* \* \*